(12) United States Patent
Oka et al.

(10) Patent No.: US 8,309,853 B2
(45) Date of Patent: Nov. 13, 2012

(54) FLEXIBLE PRINTED WIRING BOARD

(75) Inventors: Yoshio Oka, Osaka (JP); Takashi Kasuga, Osaka (JP); Jinjoo Park, Osaka (JP); Kouki Nakama, Kouga (JP)

(73) Assignees: Sumitomo Electric Industries, Ltd., Osaka (JP); Sumitomo Electric Printed Circuits, Inc., Shiga (JP)

( * ) Notice: Subject to any disclaimer, the term of this patent is extended or adjusted under 35 U.S.C. 154(b) by 362 days.

(21) Appl. No.: 12/526,917

(22) PCT Filed: Feb. 15, 2008

(86) PCT No.: PCT/JP2008/052568
§ 371 (c)(1),
(2), (4) Date: Aug. 12, 2009

(87) PCT Pub. No.: WO2008/102709
PCT Pub. Date: Aug. 28, 2008

(65) Prior Publication Data
US 2010/0116525 A1      May 13, 2010

(30) Foreign Application Priority Data
Feb. 19, 2007   (JP) ................................. 2007-038388

(51) Int. Cl.
*H05K 1/00*            (2006.01)
(52) U.S. Cl. ....................................... 174/254; 174/261
(58) Field of Classification Search .................. None
See application file for complete search history.

(56) References Cited

U.S. PATENT DOCUMENTS

| | | | |
|---|---|---|---|
| 4,000,054 A * | 12/1976 | Marcantonio | 204/192.17 |
| 6,353,189 B1 * | 3/2002 | Shimada et al. | 174/255 |
| 6,376,780 B2 * | 4/2002 | Goenka et al. | 174/261 |
| 6,717,249 B2 * | 4/2004 | Akagawa | 257/679 |
| 7,132,599 B2 * | 11/2006 | Miyagawa | 174/36 |
| 7,528,325 B2 * | 5/2009 | Ide et al. | 174/255 |
| 2002/0190365 A1 | 12/2002 | Akagawa | |
| 2005/0047102 A1 | 3/2005 | Ide et al. | |
| 2007/0074903 A1 | 4/2007 | Ide et al. | |

FOREIGN PATENT DOCUMENTS

CN      1921047 A      2/2007

(Continued)

OTHER PUBLICATIONS

Japanese Notification of Reasons for Rejection, w/ partial English translation thereof, issued in Japanese Patent Application No. 2007-038388, dated Aug. 30, 2011.

(Continued)

*Primary Examiner* — Ishwarbhai Patel
(74) *Attorney, Agent, or Firm* — McDermott Will & Emery LLP

(57) ABSTRACT

A flexible printed wiring board includes a substrate, conductor wirings, a coverlay film, a jumper wiring, and through holes. The conductor wirings are disposed on a first surface of the substrate. The coverlay film covers at least part of the conductor wirings. The jumper wiring electrically connects the conductor wirings to each other. The through holes are formed in the substrate and respectively open to the surfaces of the conductor wirings. The jumper wiring is composed of a hardened material of a conductive paste and is formed so that a second surface of the substrate is continuous with respective surfaces of the conductor wirings to which the through holes open.

3 Claims, 5 Drawing Sheets

FOREIGN PATENT DOCUMENTS

| | | |
|---|---|---|
| JP | 61-224396 | 10/1986 |
| JP | 62-105494 A | 5/1987 |
| JP | 62-120096 | 6/1987 |
| JP | 3-136299 | 6/1991 |
| JP | 2005-071808 | 3/2005 |

OTHER PUBLICATIONS

Chinese Office Action, w/ English translation thereof, issued in Chinese Patent Application No. CN 200880005451.7 dated Aug. 3, 2010.
European Search Report issued in European Patent Application No. 08711398.1-1232, mailed Jul. 26, 2010.

* cited by examiner (a)

(b)

(c)

(d)

(e)

FLEXIBLE PRINTED WIRING BOARD

RELATED APPLICATIONS

This application is the U.S. National Phase under 35 U.S.C. §371 of International Application No. PCT/JP2008/052568, filed on Feb. 15, 2008, which in turn claims the benefit of Japanese Application No. 2007-038388, filed on Feb. 19, 2007, the disclosures of which Applications are incorporated by reference herein.

TECHNICAL FIELD

The present invention relates to a flexible printed wiring board including a jumper wiring, formed of a conductive paste, for electrically connecting between conductor wirings.

BACKGROUND ART

In the field of electronic appliances, flexible printed wiring boards packaged with electronic components and provided with jumper wirings are used. Jumper wirings are circuits that electrically connect between conductor wirings formed on printed wiring boards. Jumper wirings connect between conductor wirings disposed at positions remote from each other.

For example, Patent Literature 1 discloses a printed wiring board including a substrate, a plurality of conductor wirings disposed on a surface of the substrate, an insulating layer disposed on surfaces of the conductor wirings, and a jumper wiring, formed of a conductive paste, for electrically connecting the plurality of conductor wirings. In the printed wiring board disclosed in this literature, through holes that open to surfaces of conductor wirings are formed in the insulating layer. A jumper wiring is formed by filling the through holes with a conductive paste and applying the conductive paste on the surface of the insulating layer.

[Patent Literature 1] Japanese Unexamined Patent Application Publication No. 61-224396

DISCLOSURE OF INVENTION

In recent years, as the size of electronic appliances becomes smaller, the density of electronic components packaged on flexible printed wiring boards is increasing. However, in conventional printed circuit boards, jumper wirings must be designed so that the jumper wirings do not interfere with electronic components mounted on printed wiring boards. Accordingly, as the density of the electronic components mounted on the flexible printed wiring boards increases, it becomes more and more difficult to provide jumper wiring designs that prevent interference of jumper wirings with electronic components.

Moreover, in the conventional printed wiring boards, the positions where electronic components are mounted are limited. In other words, since an insulating layer is formed on surfaces of conductor wirings and a conductive paste is applied on the surface of the insulating layer to form a jumper wiring, electronic components must be mounted at positions where they do not interfere with the jumper wiring. Consequently, a flexible printed wiring board including jumper wirings has had a problem in that electronic components cannot be mounted densely.

An object of the present invention is to provide a flexible printed wiring board that facilitates designing of jumper wirings formed on the flexible printed wiring board and increases the density of electronic components to be mounted on the flexible printed wiring board.

To achieve the object, a first aspect of the present invention provides a flexible printed wiring board that includes a substrate having a first surface and a second surface, a plurality of conductor wirings disposed on the first surface of the substrate, an insulating layer covering at least part of the conductor wirings, and a jumper wiring for electrically connecting the plurality of conductor wirings to each other. The substrate has a plurality of through holes that respectively open to surfaces of the plurality of conductor wirings. The jumper wiring is composed of a hardened material of a conductive paste and is formed so that the second surface of the substrate is continuous with the surfaces of the plurality of conductor wirings to which the through holes open.

According to this structure, through holes that respectively open to surfaces of the plurality of conductor wirings are formed in the substrate. The jumper wiring is composed of a hardened material of a conductive paste and is formed so that the second surface of the substrate is continuous with the surfaces of the plurality of conductor wirings to which the through holes open. Thus, the jumper wiring and the electronic component mounted on the flexible printed wiring board do not interfere with each other. In other words, a jumper wiring for electrically connecting between conductor wirings need not be formed on the first surface of the substrate on which the conductor wirings are disposed. Thus, a jumper wiring that does not interfere with the electronic component can be easily formed on the flexible printed wiring board. Accordingly, the jumper wiring to be formed on the flexible printed wiring board can be easily designed. Since there is no need to provide a jumper wiring on the first surface of the substrate where the conductor wirings are disposed, more electronic components that do not interfere with the jumper wiring can be mounted on the flexible printed wiring board. Thus, the electronic components can be mounted densely on the flexible printed wiring board.

The flexible printed wiring board described above may include another insulating layer disposed on the surface of the jumper wiring. According to this structure, since another insulating layer is further disposed on the surface of the jumper wiring, the jumper wiring can be protected and the reliability of connection between the electrically connected conductor wirings can be enhanced.

A second aspect of the present invention provides a flexible printed wiring board that includes a substrate having a first and a second surface, a first conductor wiring disposed on the first surface of the substrate, a second conductor wiring disposed on the second surface of the substrate, a first insulating layer covering at least part of the first conductor wiring, a second insulating layer covering at least part of the second conductor wiring, and a jumper wiring for electrically connecting the first conductor wiring to the second conductor wiring. The substrate and the second insulating layer have a first through hole that opens to a surface of the first conductor wiring. The second insulating layer has a second through hole that opens to a surface of the second conductor wiring. The jumper wiring is composed of a hardened material of a conductive paste and is formed so that a surface of the second insulating layer, the surface of the first conductor wiring to which the first through hole opens, and the surface of the second conductor wiring to which the second through hole opens are continuous.

According to this structure, the first through hole that opens to the surface of the first conductor wiring is formed in the substrate and the second insulating layer. The second through hole that opens to the surface of the second conductor wiring is formed in the second insulating layer. The jumper wiring is composed of a hardened material of a conductive paste and is formed so that a second surface of the substrate, the surface of the first conductor wiring to which the first through hole opens, and the surface of the second conductor wiring to which the second through hole opens are continuous. Thus, the jumper wiring and the electronic component mounted on the flexible printed wiring board do not interfere with each other. In other words, a jumper wiring for electrically connecting the first conductor wiring to the second conductor wiring does need not be provided on the first surface of the substrate where the first conductor wiring is formed. Thus, a jumper wiring that does not interfere with the electronic component can be easily formed. Accordingly, the jumper wiring to be formed on the flexible printed wiring board can be easily designed. Since there is no need to provide a jumper wiring on the first surface of the substrate where the first conductor wiring is provided, more electronic components that do not interfere with the jumper wiring can be mounted on the flexible printed wiring board. Thus, the electronic components can be mounted densely on the flexible printed wiring board.

The flexible printed wiring board described above may include a third insulating layer disposed on the surface of the jumper wiring. According to this structure, since the third insulating layer is disposed on the surface of the jumper wiring, the jumper wiring can be protected and the reliability of connection between the electrically connected conductor wirings can be enhanced.

An electronic component is mounted on the flexible printed wiring board described above. According to this structure, since the electronic component is mounted on the flexible printed wiring board described above, a flexible printed wiring board on which electronic components are densely mounted can be obtained.

In the flexible printed wiring board described above, the electronic component is mounted on the substrate, at a position facing the jumper wiring. According to this structure, an electronic component can be mounted on the rear side of the jumper wiring (position on the substrate facing the jumper wiring). Thus, components can be highly densely mounted on the flexible printed wiring board. Furthermore, when a large amount of heat is generated from the electronic component, the heat generated from the electronic component is conducted to the jumper wiring. The jumper wiring formed of the hardened material of the conductive paste has good thermal conductivity. Thus, the heat radiation from the electronic component can be accelerated.

Figure 3:
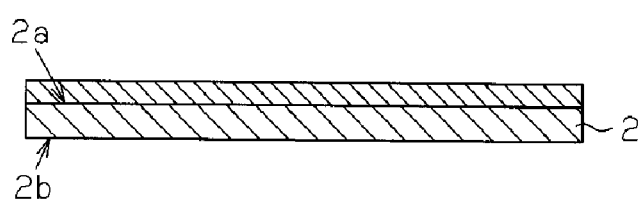
Figure 3:
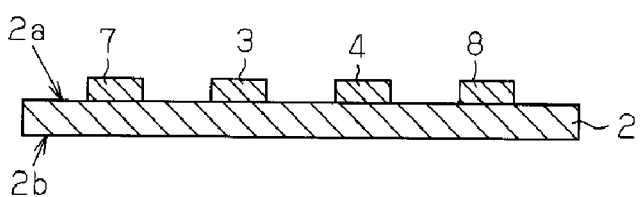
Figure 3:
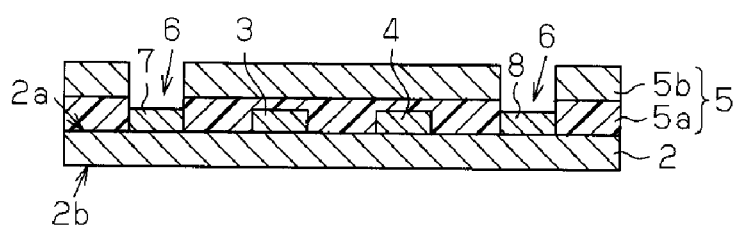
Figure 3:
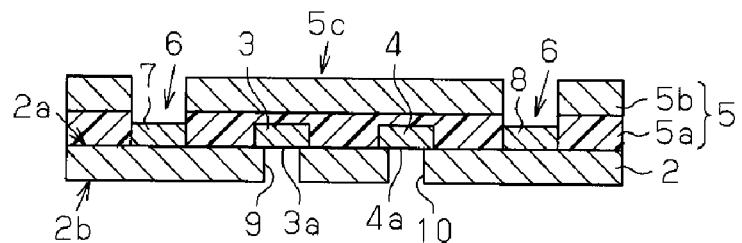
Figure 3:
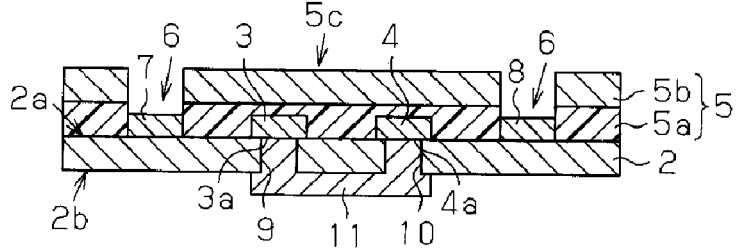

Part (a) to Part (e) of FIG. 3 are cross-sectional views showing a flexible printed wiring board production process according to the first embodiment.

Figure 1:
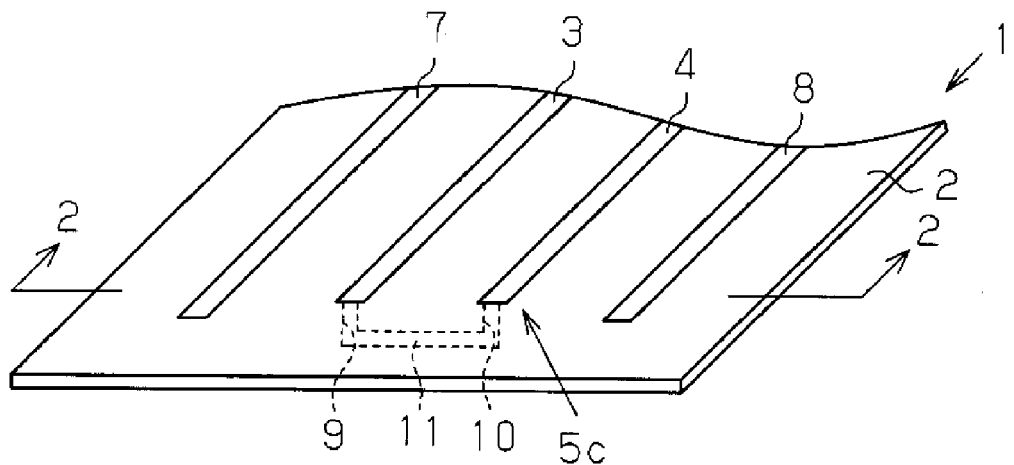
FIG. 1 is a perspective view showing a flexible printed wiring board according to a first embodiment of the present invention.
Figure 4:
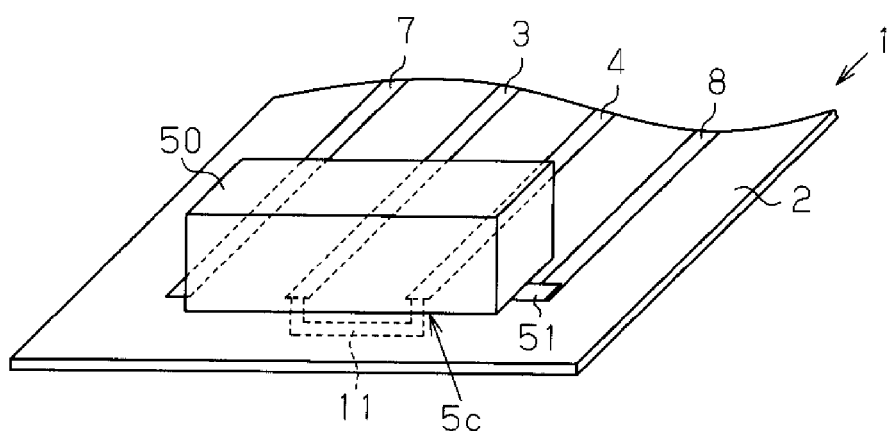

FIG. 4 is a perspective diagram showing a state in which an electronic component is mounted on the flexible printed wiring board shown in FIG. 1.

Figure 5:
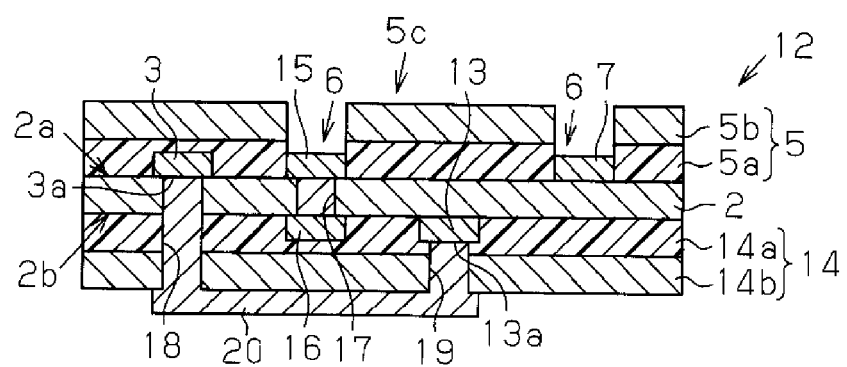

FIG. 5 is a cross-sectional view showing a flexible printed wiring board according to a second embodiment of the present invention.

Figure 6:
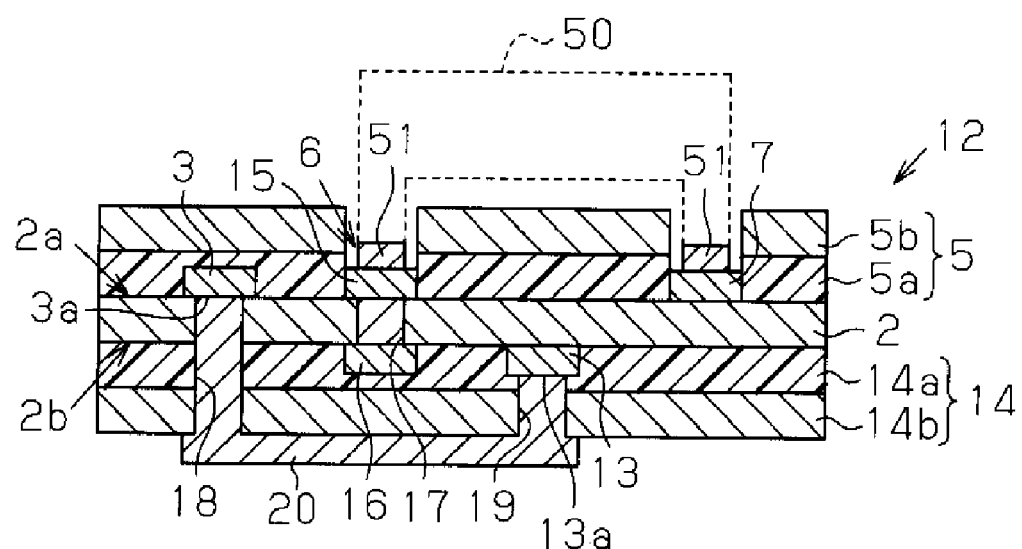

FIG. 6 is a cross-sectional view showing a state in which an electronic component is mounted on the flexible printed wiring board shown in FIG. 5.

Figure 7:
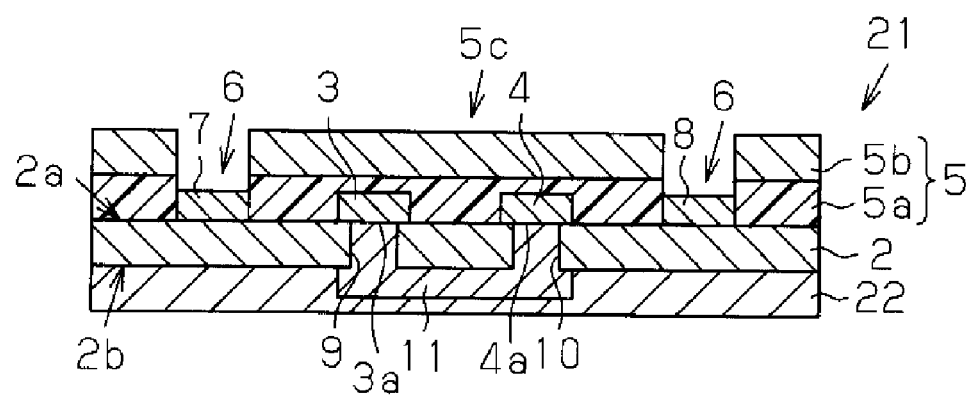

FIG. 7 is a cross-sectional view showing a flexible printed wiring board according to a third embodiment of the present invention.

Figure 8:
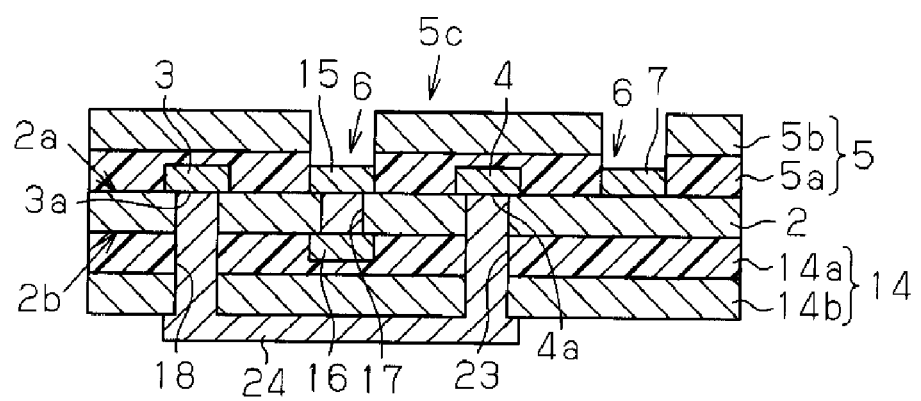

FIG. 8 is a cross-sectional view showing a modification of a flexible printed wiring board of the present invention.

Figure 9:
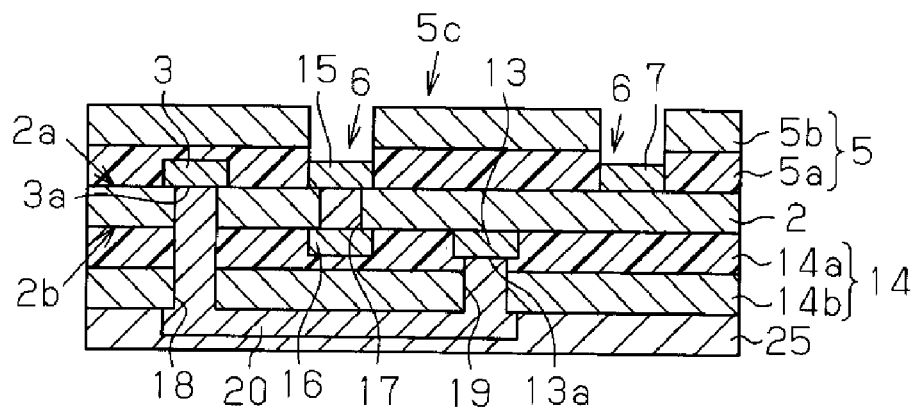

FIG. 9 is a cross-sectional view showing another modification of a flexible printed wiring board of the present invention.

BEST MODES FOR CARRYING OUT THE INVENTION

First Embodiment

Figure 2:
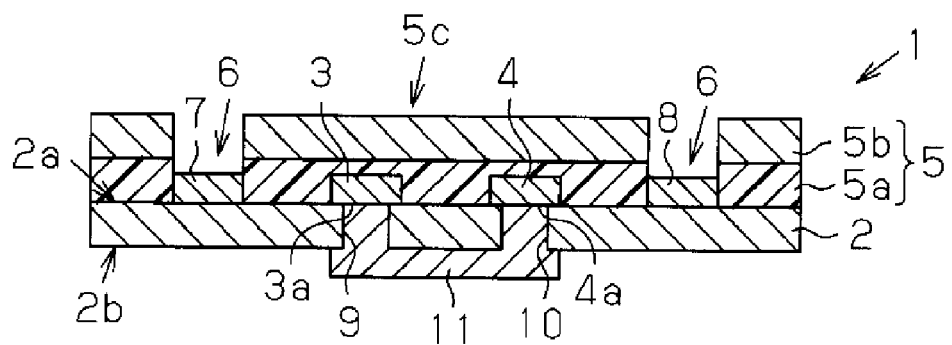
FIG. 2 is a cross-sectional view showing the flexible printed wiring board according to the first embodiment.

Preferred embodiments of the present invention will now be described as follows. FIG. 1 is a perspective view showing a flexible printed wiring board according to a first embodiment of the present invention. FIG. 2 is a cross-sectional view taken along line 2-2 in FIG. 1. FIG. 3 includes cross-sectional views showing a flexible printed wiring board production process according to the first embodiment. FIG. 4 is a perspective view showing a state in which an electronic component is mounted on the flexible printed wiring board of the first embodiment.

An electronic component 50 shown in FIG. 4 is mounted on a flexible printed wiring board 1 of the present invention. The flexible printed wiring board 1 is a single-sided flexible printed wiring board including a substrate 2 and conductor wirings 3 and 4, as shown in FIG. 2. The substrate 2 is formed of a flexible resin film. The conductor wirings 3 and 4 are disposed on a first surface 2*a* of the substrate 2. The flexible printed wiring board 1 further includes a coverlay film 5 disposed on surfaces of the conductor wirings 3 and 4. The coverlay film 5 functions as an insulating layer that covers at least part of the conductor wirings 3 and 4. The coverlay film 5 is constituted by an adhesive layer 5*a* layered on the conductor wirings 3 and 4 and a resin film 5*b* layered on the adhesive layer 5*a*. The coverlay film 5 has a component mounting surface 5*c* on which the electronic component 50 is mounted. Although the coverlay film 5 is used as the insulating layer in this embodiment, a solder resist may be used instead of the coverlay film 5. Alternatively, the conductor wirings 3 and 4 may be disposed on the first surface 2*a* of the substrate 2 through an adhesive layer (not shown). However, considering the flexibility and dimensional stability of the flexible printed wiring board 1, the conductor wirings 3 and 4 are preferably formed on the first surface 2*a* of the substrate 2 without using any adhesive layer. The flexible printed wiring board 1 also includes conductor wirings 7 and 8 in addition to the conductor wirings 3 and 4. The conductor wirings 7 and 8 each have a connecting part 6 for a connection to a terminal 51 of the electronic component 50. The flexible printed wiring board 1 further includes through holes 9 and 10 penetrating the substrate 2 and a jumper wiring 11 for electrically connecting the conductor wirings 3 and 4.

Resin films composed of resin materials having good flexibility are used as the substrate 2 and the resin film 5*b* of the coverlay film 5. For example, resin films, such as polyimide films and polyester films, that are used in flexible printed wiring boards and have versatility are used as such resin films. In particular, a resin film having high heat resistance in addition to flexibility is preferred. For example, polyamide-type resin films, polyimide-type resin films such as polyimide and polyamide-imide, and polyethylene naphthalate are preferably used as such resin films.

As the metal foils constituting the conductor wirings 3, 4, 7, and 8, for example, copper or an alloy mainly composed of copper is preferably used in view of conductive property and durability. For example, copper thin films, tin-containing copper alloy thin films, chromium-containing copper alloy thin films, zinc-containing copper alloy thin films, zirconium-containing copper alloy thin films, and the like are used as such metal foils.

An adhesive having good flexibility and heat resistance is preferred as the adhesive constituting the adhesive layer 5a. Examples of such an adhesive include various resin-type adhesives such as nylon-type, epoxy resin-type, butyral resin-type, and acryl resin-type adhesives.

In this embodiment, as shown in FIG. 2, the through holes (bottomed via holes) 9 and 10 that open to the surfaces of the conductor wirings 3 and 4 are formed in the substrate 2. The flexible printed wiring board 1 further includes the jumper wiring 11 that electrically connect the conductor wirings 3 and 4. The jumper wiring 11 is made of a hardened material of a conductive paste. The jumper wiring 11 is formed so that a second surface 2b of the substrate 2 is continuous with respective surfaces 3a and 4a of the conductor wirings 3 and 4 to which the through holes 9 and 10 open.

A conductive paste in which a conductive filler such as a metal powder is dispersed in a binder resin is used as the conductive paste constituting the jumper wiring 11. For example, silver, platinum, gold, copper, nickel, palladium, and the like can be used as the metal powder. Among these metal powders, a silver powder and a silver-coated copper powder are preferably used since they exhibit good conductive property. Moreover, epoxy resins, phenol resins, polyester resins, polyurethane resins, acryl resins, melamine resins, polyimide resins, polyamide-imide resins, and the like are used as the binder resins, for example. Among these resins, thermosetting resins are preferably used since the heat resistance of the conductive paste is improved. In this embodiment, epoxy resins are preferably used.

There is no particular limitation as to the epoxy resins used. However, for example, bisphenol A, F, S, and AD, a bisphenol A/bisphenol F copolymer-type epoxy resin, a naphthalene-type epoxy resin, a novolac-type epoxy resin, a biphenyl-type epoxy resin, a dicyclopentadiene-type epoxy resin, and the like are used as the epoxy resin. A phenoxy resin may also be used as a high-molecular-weight epoxy resin.

The binder resin may be dissolved in a solvent and used. For example, an ester-type, ether-type, ketone-type, ether ester-type, alcohol-type, hydrocarbon-type, or amine-type organic solvent or the like is used as the solvent. The conductive paste is filled in the through holes 9 and 10 by screen-printing or the like. Thus, it is preferable to use a high-boiling-point solvent having good printability. In particular, carbitol acetate or butyl carbitol acetate is preferably used as such a solvent. These solvents may be used in combination of a plurality of types. The materials are mixed and dispersed with a three roll mill, a rotary stirring/defoaming machine, or the like to make a homogeneous mixture and to thereby prepare a conductive paste.

According to this embodiment, the through holes 9 and 10 that open to the surfaces of the conductor wirings 3 and 4 are formed in the substrate 2. The jumper wiring 11 is composed of a hardened material of a conductive paste and is formed so that the second surface 2b of the substrate 2 is continuous with the respective surfaces 3a and 4a of the conductor wirings 3 and 4 to which the through holes 9 and 10 open. With this structure, the jumper wiring 11 for electrically connecting between the conductor wirings 3 and 4 need not be formed on the component mounting surface 5c of the substrate 2.

A method for making the flexible printed wiring board 1 will now be described with reference to the drawings. First, as shown in part (a) of FIG. 3, a substrate 2 made of a flexible resin film is prepared. A metal foil such as a copper foil is layered on a first surface 2a of the substrate 2. Then the layered metal foil is etched in the usual manner. As shown in part (b) of FIG. 3, conductor wirings 3, 4, 7, and 8 are formed as a result.

Next, as shown in part (c) of FIG. 3, a resin film 5b with an adhesive layer 5a is laminated on the substrate 2 except for the peripheral portions of the connecting parts 6 to bond the coverlay film 5 on the substrate 2. Then, as shown in part (d) of FIG. 3, UV-YAG laser is used from the second surface 2b of the substrate 2 to form the through holes 9 and 10. Smears are removed by a chemical process.

Next, a nickel plating layer (not shown) is formed on the exposed surfaces 3a and 4a of the conductor wirings 3 and 4. Subsequently, a gold plating layer (not shown) is formed on the surface of the nickel plating layer. As shown in part (e) of FIG. 3, the through holes 9 and 10 are filled with a conductive paste by a screen-printing method and the second surface 2b of the substrate 2 is coated with the conductive paste. After filling of and coating with the conductive paste, the conductive paste is hardened by heat treatment to form the jumper wiring 11. The nickel plating and gold plating may be omitted. However, it is better to perform nickel plating and gold plating if high reliability is necessary.

With this flexible printed wiring board 1, as shown in FIGS. 4 and 5, the terminals 51 of the electronic component 50 are connected to the connecting parts 6 of the conductor wirings 7 and 8 to thereby mount the electronic component 50 on the component mounting surface 5c of the coverlay film 5. In other words, the "mounted state" refers to a state in which the electronic component 50 is mounted on the flexible printed wiring board 1.

The first embodiment described above can achieve following effects.

(1) The through holes 9 and 10 that open to the respective surfaces of the conductor wirings 3 and 4 are formed in the substrate 2. The jumper wiring 11 is composed of a hardened material of a conductive paste and is formed so that the second surface 2b of the substrate 2 is continuous with the respective surfaces 3a and 4a of the conductor wirings 3 and 4 to which the through holes 9 and 10 open. Consequently, as shown in FIG. 4, the jumper wiring 11 and the electronic component 50 mounted on the flexible printed wiring board 1 do not interfere with each other. In other words, the jumper wiring 11 for electrically connecting between the conductor wirings 3 and 4 need not be provided on the surface 2a of the substrate 2 where the conductor wirings 3, 4, 7, and 8 are disposed. Thus, the jumper wiring 11 that does not interfere with the electronic component 50 can be easily formed. Accordingly, the jumper wiring 11 to be formed on the flexible printed wiring board 1 can be easily designed. Since there is no need to provide any jumper wiring 11 on the surface 2a of the substrate 2 where the conductor wirings 3, 4, 7, and 8 are formed, more electronic components 50 that do not interfere with the jumper wiring 11 can be mounted on the flexible printed wiring board 1. Thus, the electronic components 50 can be mounted densely on the flexible printed wiring board 1.

(2) In the mounted state described above, the electronic component 50 is mounted on the flexible printed wiring board 1 as shown in FIG. 4. Thus, since the electronic component 50 is mounted on the flexible printed wiring board 1 having the effect of (1) above, a flexible printed wiring board 1 on which electronic components 50 are densely mounted can be obtained.

Second Embodiment

Next, a second embodiment of the present invention is described. FIG. 5 is a cross-sectional view of a flexible printed wiring board according to the second embodiment of the present invention. The same components as the first embodiment are referred by the same reference symbols and the description therefor is omitted. FIG. 6 is a cross-sectional view showing the state in which an electronic component is mounted on a flexible printed wiring board of the second embodiment.

An electronic component 50 shown in FIG. 6 is mounted on a flexible printed wiring board 12 of the present invention. As shown in FIG. 5, the flexible printed wiring board 12 includes a substrate 2, a conductor wiring 3 serving as a first conductor wiring, and a coverlay film 5 serving as a first insulating layer. The conductor wiring 3 is disposed on a surface 2a of the substrate 2. The coverlay film 5 is formed on the surface of the conductor wiring 3 to cover at least part of the conductor wiring 3. The flexible printed wiring board 12 further includes a conductor wiring 13 serving as a second conductor wiring and a coverlay film 14 serving as a second insulating layer. In other words, the flexible printed wiring board 12 is a double-sided flexible printed wiring board. The conductor wiring 13 is disposed on a second surface 2b of the substrate 2. The coverlay film 14 is formed on the surface of the conductor wiring 13 to cover at least part of the conductor wiring 13. The flexible printed wiring board 12 also includes a plurality of conductor wirings 7 and 15 in addition to the conductor wirings 3 and 13. The conductor wirings 7 and 15 each have a connecting part 6 for a connection to a terminal 51 of the electronic component 50. The flexible printed wiring board 12 further includes through holes 18 and 19 and a jumper wiring 20 that electrically connects the conductor wirings 3 and 13.

As the metal foils constituting the conductor wirings 13, 15, and 16, for example, copper or an alloy mainly composed of copper is preferably used in view of conductive property and durability. For example, copper thin films, tin-containing copper alloy thin films, chromium-containing copper alloy thin films, zinc-containing copper alloy thin films, zirconium-containing copper alloy thin films, and the like are used as such metal foils. A conductive paste similar to the conductive paste used for forming the jumper wiring 11 in the first embodiment can be used as the conductive paste that fills a through hole 17 formed in the substrate 2.

The coverlay film 14 is constituted by an adhesive layer 14a and a resin film 14b layered on the adhesive layer 14a. An adhesive similar to the adhesive constituting the adhesive layer 5a can be used as the adhesive constituting the adhesive layer 14a. A resin film similar to the resin film 5b can be used as the resin film 14b. Instead of the coverlay film 14, a solder resist may be used as the second insulating layer.

In this embodiment, as shown in FIG. 5, a first through hole (bottomed via hole) 18 that opens to the surface of the conductor wiring 3 is formed in the substrate 2 and the coverlay film 14. A second through hole (bottomed via hole) 19 that opens to the surface of the conductor wiring 13 is formed in the coverlay film 14. The flexible printed wiring board 12 includes a jumper wiring 20 that electrically connects the conductor wirings 3 and 13. The jumper wiring 20 is made of a hardened material of a conductive paste and is formed so that the second surface 2b of the substrate 2 is continuous with a surface 3a of the conductor wiring 3 to which the first through hole 18 opens and a surface 13a of the conductor wiring 13 to which the second through hole 19 opens. A conductive paste similar to the conductive paste used in forming the jumper wiring 11 in the first embodiment can be used as the conductive paste for forming the jumper wiring 20.

According to this embodiment, the first through hole 18 that opens to the surface of the conductor wiring 3 is formed in the substrate 2 and the coverlay film 14. The second through hole 19 that opens to the surface of the conductor wiring 13 is also formed in the coverlay film 14. The jumper wiring 20 is made of a hardened material of a conductive paste and is formed so that the second surface 2b of the substrate 2 is continuous with the surface 3a of the conductor wiring 3 to which the first through hole 18 opens and the surface 13a of the conductor wiring 13 to which the second through hole 19 opens. With this structure, the jumper wiring 20 for electrically connecting between the conductor wirings 3 and 13 need not be formed on a component mounting surface 5c of the substrate 2.

With the flexible printed wiring board 12 having such a structure, as shown in FIG. 6, the terminals 51 of the electronic component 50 are connected to the connecting parts 6 of the conductor wirings 7 and 15 to thereby mount the electronic component 50 on the component mounting surface 5c of the coverlay film 5. In other words, the "mounted state" refers to a state in which the electronic component 50 is mounted on the flexible printed wiring board 12.

In this embodiment, the connecting parts 6 to which the terminals 51 of the electronic component 50 are connected are formed at the component mounting surface 5c. The jumper wiring 20 is disposed below the connecting parts 6 to which the terminals of the electronic component are connected. In other words, the electronic component 50 is mounted on the substrate 2, at a position facing the jumper wiring 20. With this structure, when a large amount of heat is generated from the electronic component 50, the heat generated from the electronic component 50 is conducted to the jumper wiring 20. In particular, the heat generated by the electronic component 50 is conducted to the conductor wiring 15, and to the conductive paste filling the through hole 17, the conductor wiring 16, and the coverlay film 14, sequentially in that order. The heat is eventually conducted to the jumper wiring 20 disposed on the surface of the coverlay film 14.

The second embodiment described above can achieve following effects.

(3) The through hole 18 that opens to the surface of the conductor wiring 3 is formed in the substrate 2 and the coverlay film 14. The through hole 19 that opens to the surface of the conductor wiring 13 is formed in the coverlay film 14. The jumper wiring 20 is made of a hardened material of a conductive paste and is formed so that the second surface 2b of the substrate 2 is continuous with the surface 3a of the conductor wiring 3 to which the first through hole 18 opens and the surface 13a of the conductor wiring 13 to which the second through hole 19 opens. Consequently, as shown in FIG. 6, the jumper wiring 20 and the electronic component 50 mounted on the flexible printed wiring board 12 do not interfere with each other. In other words, since the jumper wiring 20 for electrically connecting between the conductor wirings 3 and 13 need not be provided on the surface 2a of the substrate 2 on which the conductor wirings 3, 15, and 7 are provided, a jumper wiring 20 that does not interfere with the electronic component 50 mounted on the component mounting surface 5c can be easily formed. Accordingly, the jumper wiring 20 to be formed on the flexible printed wiring board 12 can be easily designed. Moreover, there is no need to form the jumper wiring 20 on the first surface 2a of the substrate 2 where the conductor wirings 3, 15, and 7 are formed. Thus, more electronic components 50 that do not interfere with the jumper wiring 20 can be formed on the flexible printed wiring board 12. Thus, the electronic components 50 can be mounted densely on the flexible printed wiring board 12.

(4) In the mounted state described above, the electronic component 50 is mounted on the flexible printed wiring board 12 as shown in FIG. 6. Thus, since the electronic component 50 is mounted on the flexible printed wiring board 12 having the effect of (3) above, a flexible printed wiring board 12 on which electronic components 50 are densely mounted can be obtained.

(5) As shown in FIG. 6, the electronic component 50 is mounted on the substrate 2, at a position facing the jumper wiring 20. Thus, when a large amount of heat is generated from the electronic component 50, the heat generated from the electronic component 50 is conducted to the jumper wiring 20. The jumper wiring 20 made from the conductive paste has good thermal conductivity. Thus, the heat radiation from the electronic component 50 can be accelerated.

Third Embodiment

Next, a third embodiment of the present invention is described. FIG. 7 is a cross-sectional view of a flexible printed wiring board according to the third embodiment of the present invention. The same components as the first embodiment are referred by the same reference symbols and the description therefor is omitted.

An electronic component is mounted on a flexible printed wiring board 21 of the present invention. The flexible printed wiring board 21 is a single-sided flexible printed wiring board including a substrate 2 and conductor wirings 3 and 4, as shown in FIG. 7. The flexible printed wiring board 21 further includes a coverlay film 5 that serves as an insulating layer. The coverlay film 5 covers at least part of the conductor wirings 3 and 4. The flexible printed wiring board 21 also includes a plurality of conductor wirings 7 and 8 in addition to the conductor wirings 3 and 4. The conductor wirings 7 and 8 each have a connecting part 6 for a connection to a terminal of an electronic component. Through holes (bottomed via holes) 9 and 10 that respectively open to the surfaces of the conductor wirings 3 and 4 are formed in the substrate 2. A jumper wiring 11 is composed of a hardened material of a conductive paste and is formed so that a surface 2b of the substrate 2 is continuous with the respective surfaces 3a and 4a of the conductor wirings 3 and 4 to which the through holes 9 and 10 open.

A solder resist layer 22 that serves as another insulating layer is disposed on the second surface 2b of the substrate 2 and the surface of the jumper wiring 11. The solder resist layer 22 is composed of an insulating material such as an epoxy resin. In this embodiment, although the solder resist layer 22 is used as another insulating layer, a cover coating layer formed by applying a polyimide-type ink by screen-printing or the like may be used instead.

The third embodiment described above can achieve following effects in addition to the effect of (1) above.

(6) Since the solder resist layer 22 is formed on the surface of the jumper wiring 11, the jumper wiring 11 can be protected, and the reliability of connection between the electrically connected conductor wirings 3 and 4 can be enhanced.

The present invention is not limited by the embodiments described above. The present invention may be subject to various design modifications on the basis of the essence of the invention. Such modifications are not excluded from the scope of the present invention. For example, following modifications may be made.

As shown in FIG. 8, as in the first embodiment, a flexible printed wiring board may include a substrate 2, conductor wirings 3 and 4, a coverlay film 5 disposed on a first surface 2a of the substrate 2, a coverlay film 14 disposed on a second surface 2b of the substrate 2, a jumper wiring 24, and through holes 18 and 23 that are formed in the substrate 2 and the coverlay film 14 and respectively open to the surfaces of the conductor wirings 3 and 4. To be more specific, the jumper wiring 24 may be composed of a hardened material of a conductive paste and may be formed so that the second surface 2b of the substrate 2 is continuous with respective surfaces 3a and 4a of the conductor wirings 3 and 4 to which the through holes 18 and 23 open.

In this manner, the jumper wiring 24 and the electronic component mounted on the flexible printed wiring board do not interfere with each other. In other words, a jumper wiring 24 for electrically connecting between the conductor wirings 3 and 4 need not be formed on the surface 2a of the substrate 2 where the conductor wirings 3, 7, and 15 are disposed. Thus, the jumper wiring 24 that does not interfere with the electronic component can be easily formed. Accordingly, the jumper wiring 24 to be formed on the flexible printed wiring board can be easily designed. Since there is no need to provide any jumper wiring 24 on the first surface 2a of the substrate 2 where the conductor wirings 3, 7, and 15 are formed, more electronic components 50 that do not interfere with the jumper wiring 24 can be mounted on the flexible printed wiring board. Thus, the electronic components can be mounted densely on the flexible printed wiring board.

In the third embodiment, the solder resist layer 22 that serves as another insulating layer is disposed on the surface of the jumper wiring 11. Similarly, as shown in FIG. 9, a solder resist layer 25 that serves as a third insulating layer may be disposed on the surface of the jumper wiring 20 of the second embodiment.

Since the solder resist layer 25 is formed on the surface of the jumper wiring 20, the jumper wiring 20 can be protected, and the reliability of connection between the electrically connected conductor wirings 3 and 13 can be enhanced.

The invention claimed is:

1. A flexible printed wiring board comprising:
    a substrate having a first surface on a first side of the substrate and a second surface on a second side of the substrate, the second side being on an opposite side from the first surface;
    a first conductor wiring disposed on the first surface of the substrate;
    a second conductor wiring disposed on the second surface of the substrate;
    a first insulating layer covering at least part of the first conductor wiring;
    a second insulating layer covering at least part of the second conductor wiring, the second conductor wiring separated from the first conductor wiring by the substrate; and
    a jumper wiring for electrically connecting the first conductor wiring to the second conductor wiring, wherein:
        the substrate and the second insulating layer have a first through hole that opens to a surface of the first conductor wiring,
        the second insulating layer has a second through hole that opens to a surface of the second conductor wiring, and
        the jumper wiring is composed of a hardened material of a conductive paste filling the first and second through holes such that the jumper wiring continuously extends from the first side of the substrate that is adjacent to the first conductor wiring, to the second surface of the substrate that is adjacent to the second conductor wiring.

2. The flexible printed wiring board according to claim 1, wherein: a third insulating layer is disposed on a surface of the jumper wiring, and the third insulating layer contains the first and second through holes.

3. A flexible printed wiring board wherein an electronic component is mounted on the flexible printed wiring board according to claim 1.

* * * * *